United States Patent [19]

Beall

[11] Patent Number: 5,055,889

[45] Date of Patent: Oct. 8, 1991

[54] LATERAL VARACTOR WITH STAGGERED PUNCH-THROUGH AND METHOD OF FABRICATION

[75] Inventor: John M. Beall, Dallas, Tex.

[73] Assignee: Texas Instruments Inc., Dallas, Texas

[21] Appl. No.: 429,924

[22] Filed: Oct. 31, 1989

[51] Int. Cl.⁵ ............................................. H01L 29/92
[52] U.S. Cl. ....................................... 357/14; 357/13; 357/51; 357/15; 331/117 D; 331/117 V
[58] Field of Search ...................... 357/14, 13, 15, 51, 357/89, 90; 331/117 D, 117 V

[56] References Cited

U.S. PATENT DOCUMENTS

| | | | |
|---|---|---|---|
| 4,458,215 | 7/1984 | Huang et al. | 357/14 |
| 4,463,322 | 7/1984 | Scott et al. | 350/14 |
| 4,481,487 | 11/1984 | Brehm et al. | 357/14 |
| 4,642,580 | 2/1987 | Scott | 350/14 |

Primary Examiner—Rolf Hille
Assistant Examiner—Tan Ho
Attorney, Agent, or Firm—René E. Grossman & Melvin Sharp

[57] ABSTRACT

A lateral varactor is fabricated with a recess structure that provides staggered punch-through points, enabling the varactor to be tuned through punch-through without significant non-linearities in either capacitance or Q. The lateral varactor (30) includes a cathode (32) and an anode (40) disposed on the surface of an active layer (12). The anode (40) includes a surface section (45), and a recess section (46) disposed within a recess area (50). This recess structure results in a greater active layer depth under the anode surface section (45) than under the anode recess section (46). As a result, as reverse-bias voltage on the anode increases, the depletion region (60) reaches punch-through under the anode recess section (46) prior to reaching punch-through under the anode surface section (45). As a result, varactor capacitance depends upon the contributions associated with each anode section and sidewall capacitance, so that the abrupt impedance changes caused by tuning the varactor through a punch-through point is reduced, and varactor tuning is made more continuous.

13 Claims, 4 Drawing Sheets

LATERAL VARACTOR WITH STAGGERED PUNCH-THROUGH AND METHOD OF FABRICATION

TECHNICAL FIELD OF THE INVENTION

This invention relates in general to solid state varactor devices, and more particularly relates to a lateral varactor diode with staggered punch-through tuning points, and a method of fabricating such a device.

BACKGROUND OF THE INVENTION

A varactor (variable-reactance) diode exhibits a change in capacitance as a function of bias voltage. In metal-semiconductor varactors, a Schottky junction is used to realize variable capacitance—the capacitance is determined by the depletion layer depth, which is in turn controlled by the junction bias voltage. That is, the depletion layer acts as an insulating dielectric of variable width between the capacitor formed by the anode and cathode. Examples of the use of varactors include microwave applications as variable reactance devices for harmonic generation, parametric amplification, and electronic tuning.

Most solid state varactor diodes use a vertical structure in which the anode and cathode are on opposite sides of a doped, or active, semiconductor layer, with the depth of the depletion region relative to the active layer (i.e., the distance between the anode and cathode) depending upon the reverse-bias voltage on the anode. The dimensions and doping of the active layer are controlled so that, for the operational bandwidth, the depletion region under the varactor anode does not reach the lower boundary of the active layer (i.e., the cathode), a condition called punch-through where varactor capacitance and Q factor decrease abruptly (non-linearly).

Varactor diodes can be fabricated into metal-semiconductor field effect transistor (MESFET) integrated circuits by using a lateral varactor structure in which the Schottky-contact anode and the ohmic-contact cathode are deposited onto the surface of the active layer of the semiconductor substrate (formed by epitaxy or implant). In this lateral configuration, varactor capacitance is determined by the depth of the depletion layer, together with a sidewall capacitance component determined by the lateral expansion of the depletion layer sidewall toward the cathode. The sidewall capacitance component becomes predominant in determining varactor performance after punch-through.

A fundamental problem in fabricating lateral varactor diodes in MESFET integrated circuits is that optimizing MESFET performance requires a shallow active layer with a sharply defined lower boundary. However, a shallow active layer means that achieving a reasonable bandwidth for varactor tuning requires that the varactor be tuned through punch-through, resulting in sharply degraded capacitance (C-V) and Q (Q-V) characteristics at the punch-through point where small variations in anode bias cause substantial changes in capacitance and Q. For example, broad band monolithic voltage-controlled oscillator (VCO) circuits fabricated using GaAs MESFET integrated circuit technology have a gap at mid-range tuning frequencies due to this effect ("Monolithic Voltage Controlled Oscillator for X and Ku-B Bands," B. N. Scott, et al., 1982, *IEEE Microwave Theory and Techniques Symposium Digest*).

One approach used to avoid the punch-through tuning problem for lateral varactors is to implant a deep active layer beneath the anode, completely surrounding the cathode side of the depletion region ("An Analog X-B Band Phase Shifter," D. E. Dawson, et al., 1984, *IEEE Microwave and mm-Wave Monolithic Circuits Symposium Digest of Papers*). This lateral varactor structure allows the active layer to be optimized for MESFET fabrication, while increasing varactor tuning bandwidth by allowing the varactor to be tuned from its upper capacitance limit to its lower limit without passing through punch-through (i.e., without causing the depth of the depletion layer to exceed the depth of the implanted active region under the anode). However, this approach is disadvantageous in that it requires a complex implant process—for simplified, low cost fabrication, the varactor should be fabricated using the same active layer and lithography steps as the transistors.

Accordingly, a need exists for an improved solid state lateral varactor structure to achieve a broader varactor tuning range in which abrupt changes in capacitance (and Q) are minimized. Preferably, the lateral varactor structure could be fabricated using MESFET integrated circuit technology with an active layer optimized for MESFET performance.

SUMMARY OF THE INVENTION

The present invention is an improved solid-state lateral varactor diode that enables continuous varactor tuning through punch-through by providing staggered varactor tuning punch-through levels. As a result, the lateral varactor structure and fabrication method of the invention are adaptable to MESFET integrated circuit fabrication.

In one aspect of the invention, the lateral varactor includes an anode and a cathode disposed on an active layer formed on one surface of a substrate. The anode has at least two sections, with the depth of the active layer under one section being greater than the depth of the active layer under the other section. As a result of the staggered active layer depths, the depletion layer under each anode section has a distinct punch-through (reverse-bias) voltage. The recommended technique for obtaining staggered active layer depths is an anode recess structure in which the surface of the active layer under the second anode section is recessed relative to the surface of the active layer under the first anode section.

In more specific aspects of the invention, the lateral varactor diode is fabricated in a MESFET integrated circuit in which the depth of the active layer is optimized for MESFET performance. The cathode is formed by depositing a U-shaped ohmic contact on the substantially planar surface of the active layer.

A portion of the active layer between the legs of the U-shaped cathode is selectively etched to form a recess area. The anode is then formed by depositing a Schottky barrier contact that extends between the cathode legs, with a portion of the anode extending into the recess area. The anode, thus, includes a recessed section for which the depth of the active layer is less than that for the other anode section, providing staggered punch-through levels.

As a result of staggering punch-through levels, the contribution to total varactor capacitance from a given anode section at its associated punch-through voltage is reduced. That is, tuning the varactor through punch-through for a given anode section causes significantly less change in capacitance because of the impedance contribution from the other anode section and/or from sidewall capacitance. Thus, the lateral varactor of the invention can be continuously tuned through the staggered punch-through points with significantly reduced capacitance non-linearities.

The technical advantages of the invention include the following. The lateral varactor structure includes staggered active layer depths associated with the anode to provide multiple punch-through levels. The portion of varactor impedance associated with each of the staggered punch-through levels is less than that associated with a single punch-through level. The staggered punch-through varactor structure is adapted to fabrication in a MESFET integrated circuit in which the active layer is optimized for MESFET performance. The structure achieves substantially continuous varactor tuning performance through the multiple punch-through levels because of the reduced portion of varactor impedance associated with a given reverse-bias punch-through level. The structure can be fabricated using either a recess structure or an implant structure for providing the multiple active layer depths and associated punch-through voltages. The recess structure configuration can be fabricated using essentially the same fabrication steps used to fabricate FETs in high performance MESFET devices. The lateral varactor can be tuned through punch-through with significantly reduced capacitance non-linearities, thereby achieving a higher minimum Q for the varactor.

BRIEF DESCRIPTION OF THE DRAWINGS

For a more complete understanding of the present invention, and for further features and advantages, reference is now made to the following Detailed Description, taken in conjunction with the accompanying Drawings, in which.

DETAILED DESCRIPTION OF THE INVENTION

The Detailed Description of the preferred embodiment of the staggered punch-through lateral varactor, and fabrication method, of the invention is organized as follows:

1. Varactor Recess Structure
2. Varactor Operation
3. Fabrication Method
4. Exemplary VCO Application
5. Conclusion The preferred embodiment of the invention is described in the context of a MESFET (metal-semiconductor field effect transistor) integrated circuit in which the active layer is optimized in thickness for FET performance. In particular, this Detailed Description of the preferred embodiment is in connection with use of the varactor for microwave applications. However, the staggered punch-through structure is readily adaptable to other configurations or applications in which a design trade-off between active layer depth and varactor tuning bandwidth results in the varactor being tuned through punch-through.

Figure 1:
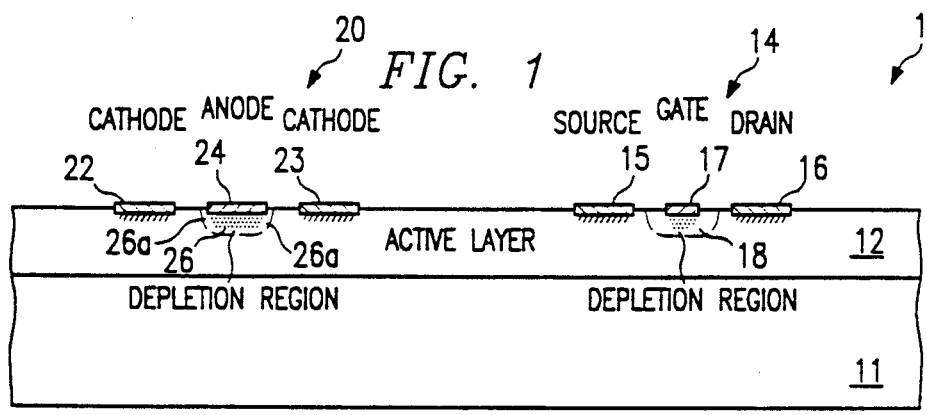
FIG. 1 schematically illustrates a portion of a MESFET integrated circuit including a FET device and a lateral varactor.

1. Varactor Recess Structure. FIG. 1 illustrates a MESFET integrated circuit in which both FETs and lateral varactors are fabricated using the same active layer.

A portion of an integrated circuit 10 includes a semiconductor substrate 11 on which is formed an active (doped) layer 12. The active region isolation boundary is designated 13.

For the preferred embodiment in which the staggered punch-through varactor is included in a MESFET integrated circuit for microwave applications, substrate 11 is semi-insulating GaAs, and active layer 12 is N-type GaAs doped with silicon. To optimize the integrated circuit for FET performance, the thickness of the active layer 12 is about 0.25 microns. Active layer 12 may be either epitaxially formed by depositing GaAs doped with silicon, or may be created by implanting a silicon dopant into the GaAs substrate 11, followed by an annealing procedure. Beyond the isolation boundary, the active layer is deactivated by implant damage or an isolation etch.

A FET 14 includes a source contact 15, a drain contact 16 and gate 17, with a depletion layer 18 extending into the active layer under the gate. Similarly, a lateral varactor 20 includes cathode contacts 22 and 23, and an anode 24, with a depletion layer 26 extending into the active layer under the anode (with sidewall portions 26a extending toward cathode contacts 22 and 23). The depth of the active layer, being selected for optimum FET performance, is relatively shallow with a sharp lower boundary to permit precise control over source drain current with gate bias voltage.

For the varactor, the metal anode forms a metal-semiconductor Schottky barrier contact. The cathode contacts 22 and 23 are ohmic (as indicated by the slanted lines underneath the cathode contacts). The contacts used to provide bias voltages for the FET gate and the varactor anode are not illustrated.

Figure 2A:
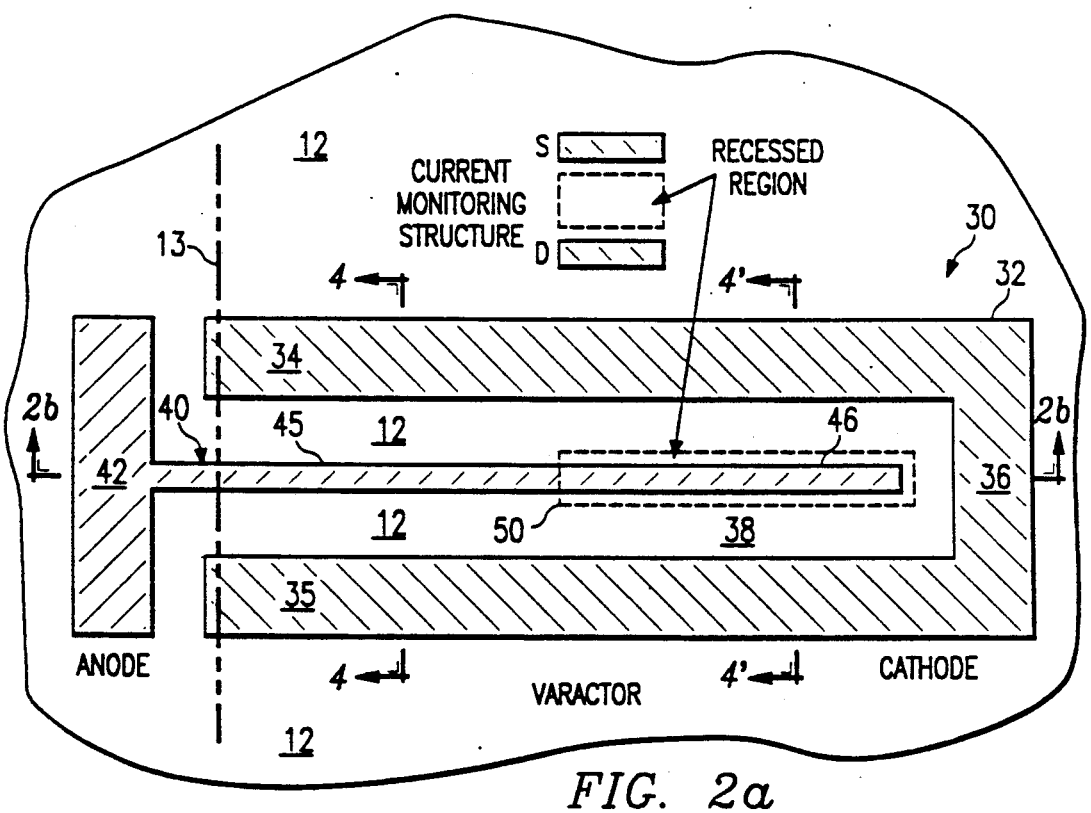
FIGS. 2a and 2b are plan and elevation diagrams illustrating a lateral varactor of this invention, with a recess structure to provide a multi-level anode with staggered active layer depths.
Figure 2B:
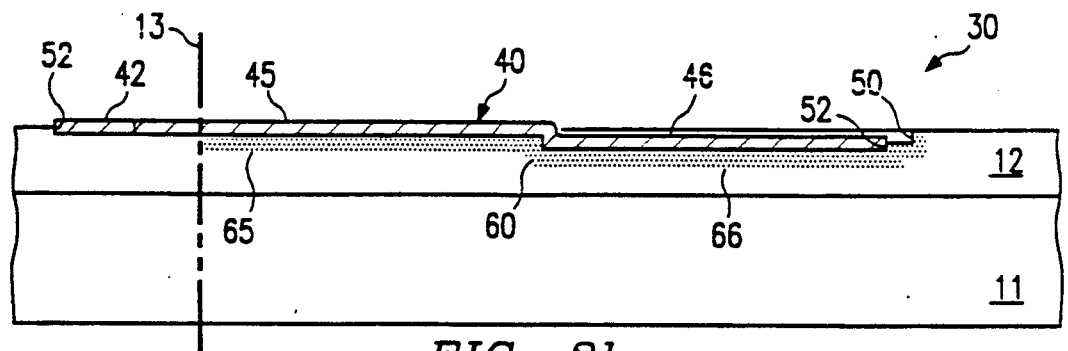

FIGS. 2a and 2b illustrate a lateral varactor using a recess structure to create staggered punch-through levels according to the invention. Again, for the preferred embodiment, the varactor is fabricated in a MESFET integrated circuit with a substantially planar active layer 12 formed on a semiconductor substrate 11.

Varactor 30 includes a U-shaped metallic cathode 32 formed as an ohmic contact on the planar surface of active layer 12. Cathode 32 includes legs 34 and 35 with a connecting segment 36. The cathode 32 defines an interior anode area 38. The cathode need not surround the anode, although this helps to reduce parasitic resistance.

A metallic anode 40 is formed on the surface of active layer 12, and includes a connection pad 42. Typically, the connection pad is placed outside the active layer isolation boundary 13. The anode 40 forms a metal-semiconductor Schottky barrier contact to the active layer.

Anode 40 projects into the anode area 38 defined by cathode 32. It includes two sections, a surface section 45, and a recess section 46. Recess section 46 extends into a recess area 50 etched into active layer 12, such that the depth of the active layer beneath recess section 46 (i.e., the distance from the recess section to the substrate 11 in FIG. 2b) is less than the active layer depth beneath anode surface section 45. A current monitoring structure is used during fabrication to control the etch procedure for recess 50.

Typically, prior to the deposition procedure for cathode 32 and anode 40, the surface of active layer 12 is notch-etched to receive the anode contact (see Section 3). The notch-etch depth is adjusted to achieve desired electrical characteristics for the FETs and varactors, such as saturation current, threshold voltage and punch-through voltage.

Selecting the precise configuration for varactor 30 (cathode 32 and anode 40), and the anode recess structure, is a matter of routine design choice. The U-shaped configuration of cathode 32 minimizes the series resistance of the varactor. Use of a U-shaped configuration for cathode 32 dictates that anode 40 project into anode area 38 defined by the cathode. A single anode 40 is shown in FIGS. 2a and 2b—typically, however, multiple anodes would be used, extending in space parallel relationship within the anode area 38. The use of multiple anodes reduces the unit anode projection length, and thereby the signal propagation delay along each anode projection.

Selecting a single recess area 50, providing a two-section anode 40, for the preferred staggered punch-through varactor was a routine design choice. The resulting two-level staggered active layer under anode 40 provides two respective varactor tuning punch-through voltages, which was found to provide satisfactorily continuous varactor tuning for the desired tuning bandwidth of the exemplary VCO application (see Section 4). However, for some applications, it may be desirable to provide more than one recess level to obtain more than two punch-through levels. Factors that determine the selection of an appropriate number of recess (punch-through) levels include the maximum allowable rate of change in capacitance as a function of bias voltage and the cost of additional levels. For most applications in which the varactor is fabricated in a MESFET integrated circuit, the two-level varactor design with one recess and two punch-through levels should be satisfactory.

Selecting the materials for the cathode and anode involves routine design choice. For the preferred GaAs integrated circuit, these contacts were fabricated using (a) for the cathode, separately deposited layers of germanium, nickel and gold, which together form the desired ohmic contact, and (b) for the anode, a multi-layer titanium, platinum and gold deposition that formed a Schottky barrier diode. Typically, the anode and cathode will be about 0.3–0.7 microns thick. Alternative materials include (a) for the anode, aluminum, and (b) for the cathode, palladium, germanium and gold, or any such alloy capable of forming an ohmic contact with the GaAs substrate.

Selecting the depth for recess area 50 involves routine design choice, subject to achieving the desired punch-through voltages for the associated anode recess section 46, or for optimum MESFET performance. For the preferred embodiment in which the active layer is about 0.25 microns thick, the recommended depth for recess area is about 0.1 microns. For anode/cathode thickness of about 0.1 micron, a notch 52 of about 0.05 microns is typical, so that anode surface section 45 is recessed about 0.05 microns while the total recess for the anode recess Section 46 is 0.15 microns.

Thus, even the anode surface section 45 is recessed into the active layer by the depth of notch 52. For the preferred embodiment in which the depth of the active layer is about 0.25 microns, anode surface section 45 is recessed approximately 20% (0.05 microns) of the thickness of the active layer, while the anode recess section 46 is recessed about 60% (0.15 microns) of the active layer thickness. Notwithstanding that the amount of recess for the anode surface section is not insignificant in comparison to the total thickness of the active layer, that section of the anode is referred to herein as the surface section, with the anode recess section being recessed relative to the anode surface section as well as the surface of active layer 12.

2. Varactor Operation. When operated in the normal mode with a reverse-bias on the anode, a depletion layer 60 is created under anode 40, extending into active layer 12. Because of the recess structure of anode 40, the depletion layer 60 includes a surface subregion 65 underlying anode surface section 45, and a recess subregion 66 underlying anode recess section 46.

For a given reverse-bias voltage on anode 40, the depletion region 60 extends into active layer 12 such that the depth of the surface subregion 65 below anode surface section 45 is substantially equal to the depth of recess subregion 66 below anode recess section 46. That is, for a given reverse-bias voltage, the recess depletion subregion 66 extends deeper into active layer 12 than the surface depletion subregion 65. Accordingly, as reverse-bias voltage is increased, the recess depletion subregion 66 reaches punch-through by contacting substrate 11 prior to the surface depletion subregion 65 reaching punch-through.

As reverse-bias is increased and reaches the first punch-through level associated with the anode recess section 46, recess depletion subregion 66 extends through active layer 12 and contacts substrate 11. While the contribution to total varactor capacitance associated with the anode recess section 46 changes abruptly at the first punch-through voltage, overall varactor capacitance does not change abruptly because of the contributions to varactor capacitance attributable to the surface depletion subregion 65 (surface anode section 45) and the depletion sidewalls (26a in FIG. 1), both of which continue to vary relatively continuously with reverse-bias voltage.

As reverse-bias voltage continues to increase, the change in varactor capacitance is made up of capacitance attributable to the deepening surface depletion subregion 65 and the expanding depletion sidewalls. When reverse-bias voltage reaches the second punch-through level where surface depletion subregion 65 extends through active layer 12 to contact substrate 11, the associated capacitance contribution changes abruptly, but again, overall varactor capacitance does not change abruptly due to the sidewall capacitance component which continues to vary relatively continuously.

Figure 3:
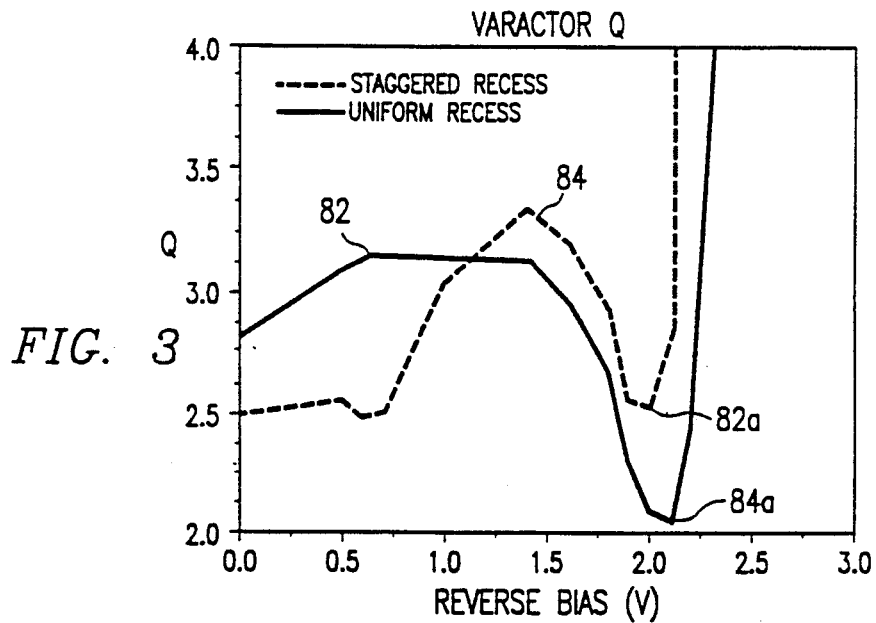
FIG. 3 is a plot of varactor Q as a function of reverse-bias voltage for both prior art varactor structures with a single punch-through point, and a staggered punch-through varactor according to the invention.

The effect on varactor Q of using the staggered punch-through varactor of the invention versus a conventional varactor with a single punch-through point is graphically illustrated in FIG. 3. A Q-V plot 82 shows varactor Q for the conventional design, while the corresponding Q-V plot 84 shows varactor Q for the staggered punch-through varactor. The varactor design goal is to raise the minimum varactor Q as high as possible to maintain oscillation throughout the tuning bandwidth. As shown by the plots of varactor Q, the minimum Q point 82a for the conventional design is significantly lower than the minimum Q point 84a for the staggered punch-through varactor. Thus, the effect on varactor Q from tuning the varactor through punch-through is much less significant for the staggered punch-through varactor design than for the conventional varactor design.

3. Fabrication Method. The fabrication method for the preferred embodiment of the staggered punch-through varactor using a recess structure to obtain a staggered active layer configuration is illustrated in FIG. 4. Conventional solid-state photolithography operations are used, so that the following discussion is general in scope.

Figure 4A:
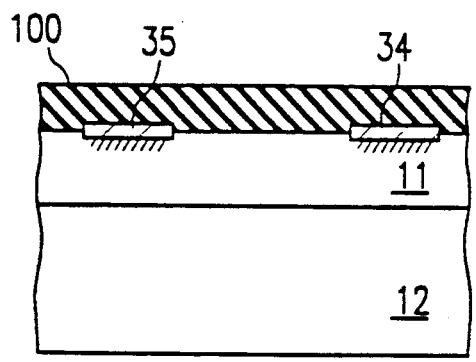
FIGS. 4aa'–4dd' are diagrammatic, illustrations of the fabrication steps for a staggered punch-through lateral varactor with- a recess structure.
Figure 4A:
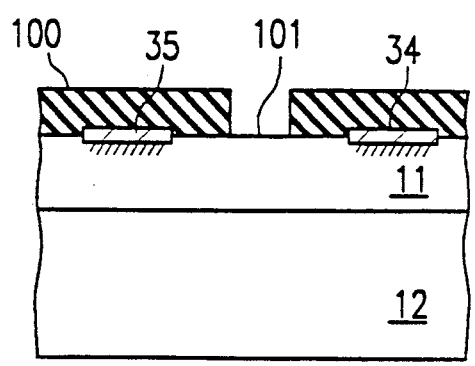

As illustrated in FIGS. 4a and 4a', after the active layer 12 is first epitaxially grown on a GaAs substrate 11, the cathode (including cathode legs 34 and 35) is deposited on the substantially planar surface of the active layer by conventional metal deposition techniques, forming an ohmic contact. A layer of photoresist 100 is applied, and patterned to expose the recess area 50 between cathode legs 34 and 35.

Figure 4B:
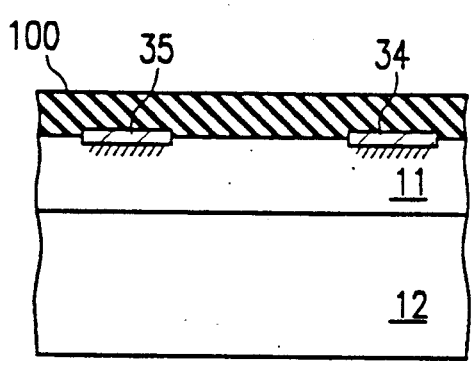
Figure 4B:
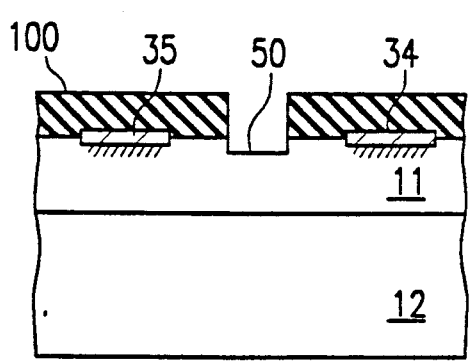

As illustrated in FIGS. 4b and 4b', an etch process is then used to create the recess area 50 in the surface of active layer 12. The etch process is controlled using a current monitoring structure (FIG. 2a). For the preferred embodiment, the depth for recess area 50 is about 0.1 microns for an active layer thickness of about 0.25 microns.

Figure 4C:
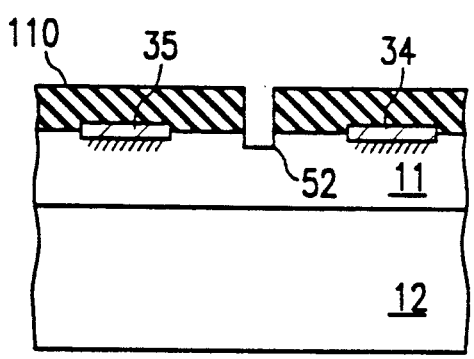
Figure 4C:
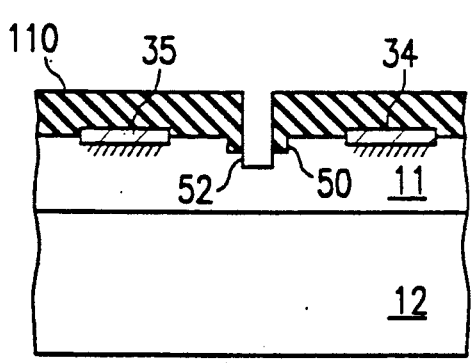

As illustrated in FIGS. 4c and 4c', a conventional notch-etch procedure is used to notch the area of the surface of active layer 12 into which anode 40 (including surface section 45 and recess section 46) will be formed. A layer of photoresist 110 is applied and patterned to define a notch 52 for anode 40, exposing both a notch area for anode surface section 45 (FIG. 4c), and a notch area for anode recess section 46 within recess area 50 (FIG. 4c'). For the preferred anode thickness of 0.1 microns, the etch procedure creates a notch of about 0.05 microns 52 in the exposed surface of active layer 12.

Figure 4D:
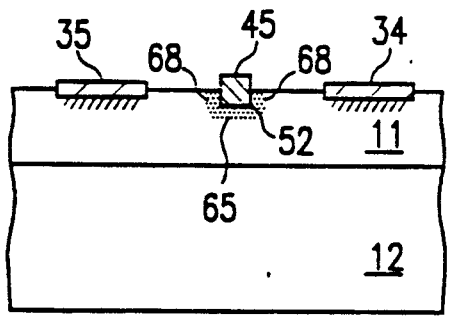
Figure 4D:
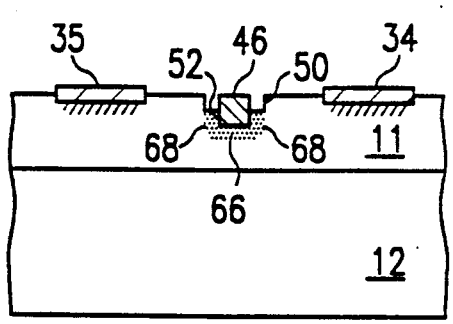

As illustrated in FIGS. 4d and 4d', the final procedure is to form anode 40, including surface section 45 and recess section 46. Using the same photoresist mask as in FIGS. 4c and 4c', the metal layers that form anode 40 are deposited into the notch-etched areas 52 of active layer 12, creating anode 40, and in particular surface section 45 (FIG. 4d) and recess section 46 in recess area 50 (FIG. 4d'). Unwanted metal is removed with the photoresist mask. For the preferred embodiment, a multi-layer deposition of the titanium, platinum and gold is used to form anode 40 to the preferred thickness of about 0.7 microns.

The foregoing fabrication method yields varactors configured as shown in FIGS. 2a and 2b. Anode 40 extends into the anode area 38 defined by the U-shaped cathode 32, and includes a surface section 45 and a recess section 46. When reverse-biased, as shown in FIG. 4d≈4d', a surface depletion subregion 65 and a recess depletion subregion 66 is induced in the area of active layer 12 surrounding anode 40 (surface section 45 and recess section 46). The depletion regions 65/66 include sidewall portions 68 that expand toward cathodes 35/34.

High-performance MESFET structures, which commonly require a double-ledge gate recess structure, can be fabricated simultaneously using steps 4a'-4d'. Therefore, the staggered punch-through varactor of the invention can be fabricated without adding manufacturing cost.

As an alternative to the preferred recess structure for fabricating a staggered punch-through varactor according to the invention, an implant procedure can be used to control the punch-through voltage of active layer 12 under anode 40. This alternate design approach is illustrated in FIGS. 5a-5c.

Figure 5A:
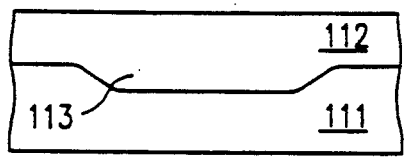
FIGS. 5a–5c are diagrammatic illustrations of the fabrication steps for a staggered punch-through lateral varactor in which an implant procedure is used to create staggered active layer depths.

As illustrated in FIG. 5a, active layer 12 is created by an implant procedure. In the area underlying anode 40 corresponding to the recess section (see FIG. 2b), the implant extends the depth of active layer 112 into substrate 111 by an additional predetermined amount, preferably about 0.1 micron (corresponding to the depth of the recess area 50 in FIG. 2a). This implant procedure creates in active layer 112 an extended active region 113. Alternatively, the implant process could be used to increase the punch-through voltage by increasing the doping density in region 50, with or without increasing the depth of the active layer.

Figure 5B:
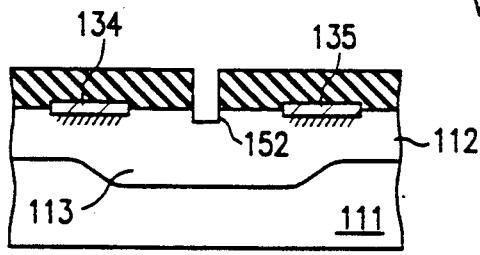

As illustrated in FIG. 5b, after forming ohmic cathode contacts 134 and 135, a patterned layer of photoresist is applied, and a notch-etch procedure is used to create a notch 152 for the anode. Notch 152 extends along the surface of active layer 112, including over the extended active region 113.

Figure 5C:
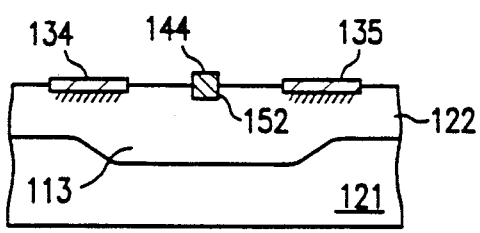

As illustrated in FIG. 5c, the final procedure is to deposit the anode 144, extending between cathode legs 134 and 135. A portion of anode 140 (corresponding to the anode recess section 46 in FIG. 2b) overlies the extended active region 113. In this manner, staggered punch-through levels are obtained, with punch-through being delayed for that portion of anode 144 overlying the extended active region 113 of active layer 122.

The advantage of this alternate implant approach to fabricating a staggered punch-through varactor according to the invention is that an extended active region can be created in which active layer thickness or doping density is increased over the nominal active layer values (which are optimized for FET performance). Thus, the punch-through point associated with the portion of anode 144 overlying the extended active region 113 of active layer 122 requires a reverse-bias voltage greater than that required for punch-through in the area of anode 144 overlying the FET-optimized active layer, which is in contrast to the recess structure where reverse-bias voltage for punch-through in the recess area is less than nominal. The disadvantage of this alternative fabrication method is that the implant procedure is more complex, requires a high-temperature post-implant anneal, and may be difficult to align without heat-tolerant alignment markers.

Another alternative fabrication method is to use selective epitaxy methods to deposit active layers of differing depths and/or doping densities in two or more regions of the varactor.

4. Exemplary VCO Application. As an exemplary application of a staggered punch-through varactor (using a recess structure) according to the invention, an integrated circuit voltage-controlled oscillator is illustrated by the functional schematic in FIG. 6.

The exemplary integrated circuit VCO 150 includes a FET 152. A source varactor 154 and a gate varactor 156 provide variable capacitance, and the distributed transmission line components 158 provide inductance, yielding the variable reactance necessary for voltage-controlled oscillation. Oscillator frequency is controlled by the varactor reverse-bias levels. Varactors are used on both the source and gate to obtain broader oscillator bandwidths.

The VCO circuit 150 is fabricated with staggered punch-through varactor devices using a recess structure in accordance with the preferred embodiment of the invention. To obtain maximum VCO bandwidth, the varactors 154 and 156 were both required to be tuned through both punch-through levels (i.e., the punch-through voltages associated with anode recess section 46 and the anode surface section 45 in FIG. 2a). In addition, for the purpose of comparison, a similar integrated VCO circuit was fabricated using conventional varactors with only a single punch-through point.

Figure 7A:
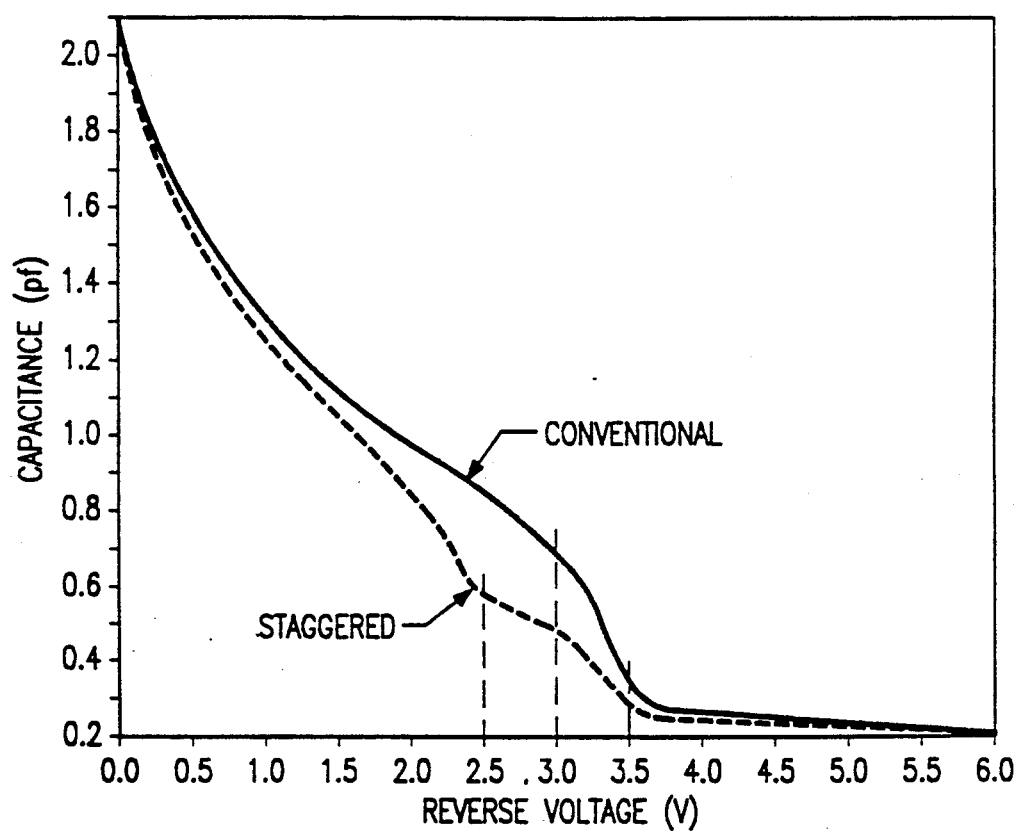
FIGS. 7a and 7b are plots of capacitance (C-V) and measured output power for a VCO circuit such as shown in FIG. 6 for both a conventional (single punch-through) varactor and the staggered punch-through varactor structure of the invention.

FIG. 7a is a plot illustrating the C-V characteristics for the conventional varactor and the staggered punch-through varactor. For the exemplary application, the conventional varactor was fabricated to achieve a punch-through voltage of 3.5 volts, while the staggered punch-through varactor was fabricated to achieve punch-through voltages of 2.5 volts for the anode recess section (shallow active layer) and 3.5 volts for the anode surface section (deep active layer).

As reverse-bias voltage increases, the capacitance presented by the staggered punch-through varactor decreases relatively continuously through the shallow (recess section) punch-through voltage of 2.5 volts to the deep punch-through voltage of 3.5 volts. In contrast, the capacitance for the conventional varactor decreases relatively more abruptly between 3 volts and its punch-through voltage of 3.5 volts. After 3.5 volts, the decrease in capacitance for both varactors levels off. Thus, the staggered punch-through varactor design of the invention provides a more continuous, smoother variation in capacitance with changes in reverse-bias voltage, allowing more continuous tuning than is obtainable from a conventional varactor design.

Figure 6:
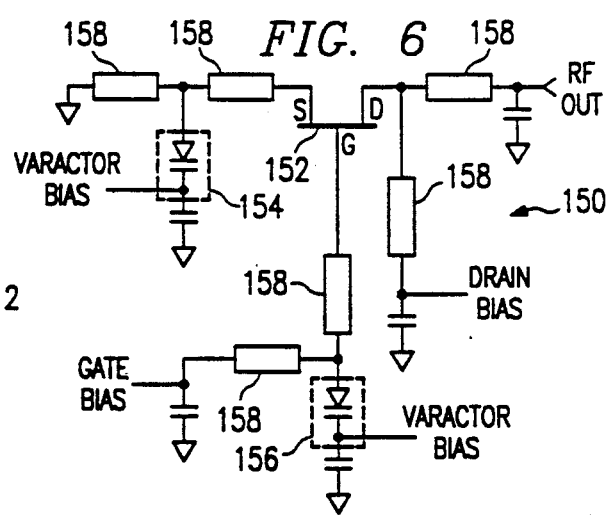
FIG. 6 is a schematic circuit diagram of an exemplary VCO (voltage controlled oscillator) application for a MESFET integrated circuit including a staggered punch-through lateral varactor.
Figure 7B:
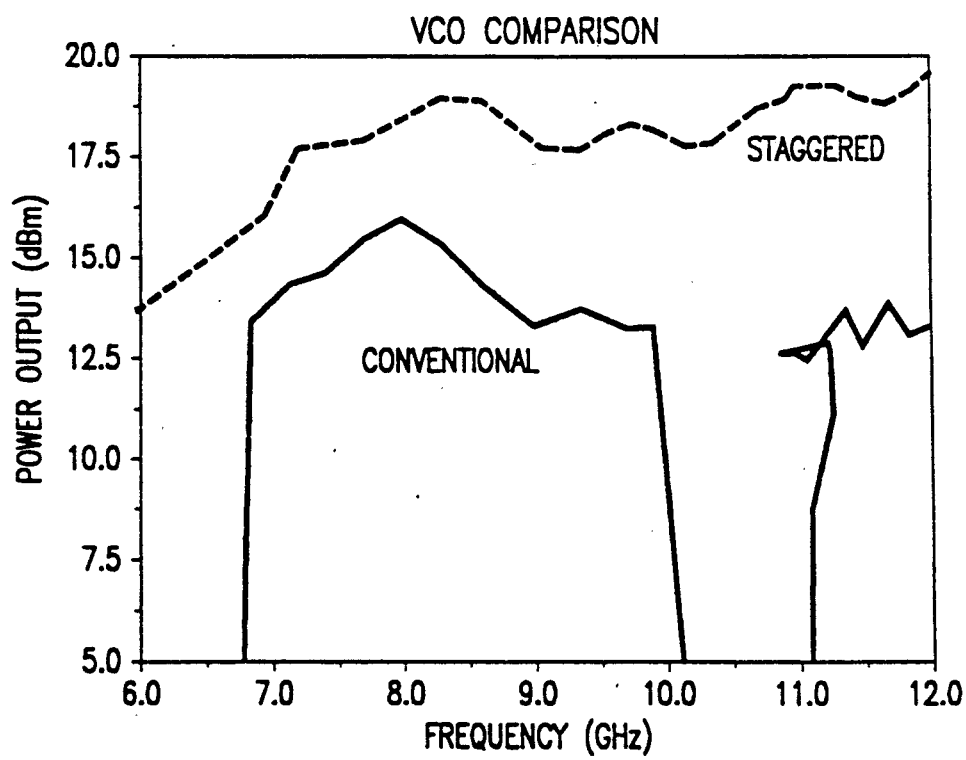

FIG. 7b is a plot illustrating measured output power versus frequency for the VCO circuit in FIG. 6 fabricated using both conventional and staggered punch-through varactors. The VCO using the conventional varactor is not able to maintain stable oscillation in the frequency range from 10.1 to 11.1 GHz—the VCO hops across the gap as the varactor bias is tuned past the single punch-through voltage (due primarily to the rapid capacitance variation at punch-through). In contrast, the VCO using the staggered punch-through varactor design of the invention operates smoothly across its full operating range, covering more than an octave of bandwidth.

5. Conclusion. The staggered punch-through varactor design of the invention enables continuous varactor tuning through punch-through, with varactor capacitance changing relatively smoothly without significant non-linearities. As a result, the staggered punch-through varactor design is particularly adaptable for fabrication in MESFET integrated circuits in which the active region is optimized for MESFET performance.

The staggered punch-through varactor uses multiple punch-through points created by staggering the depth (and/or doping) of the active layer relative to the varactor anode. As reverse-bias voltage is changed, causing a corresponding change in the depth of the depletion layer under the anode, the punch-through voltage level associated with the shallow active layer is reached before the depletion layer extends through the deep (or more highly doped) active layer region. Providing multiple, staggered punch-through levels divides varactor impedance between (a) the shallow active layer region, (b) the deep active layer region, and (c) the sidewall capacitance, so that the abrupt change in capacitance associated with a punch-through level is counteracted by the impedance components associated with the other punch-through level(s) and/or the sidewall capacitance. The staggered punch-through varactor can be fabricated using either a recess structure in which a portion of the anode is disposed in a recessed area of the active layer, or an implant structure in which a portion of the anode overlies a region of the active layer that is formed to a different depth or doping density (such as by selective implant) from that underlying the remainder of the anode.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. A lateral varactor with staggered punch-through levels, comprising:
   an active layer disposed over a substrate; and
   an anode and a cathode disposed on said active layer;
   said anode having at least first and second sections, with the punch-through between said first section and said substrate occurring at a greater voltage than the punch-through between said second section and said substrate.

2. The lateral varactor of claim 1, wherein the depth of said active layer under said first section is greater than the depth of said active layer under said second section.

3. The lateral varactor of claim 2, wherein said second anode section is recessed into said active layer relative to said first anode section.

4. The lateral varactor defined in claim 2, further comprising:
   a recess area formed in said active layer;
   said second anode section being disposed in said recess area.

5. The lateral varactor of claim 4, wherein said active layer depth is optimized for MESFET fabrication.

6. The lateral varactor of claim 1, wherein said active layer defines a substantially planar surface opposite said substrate.

7. The lateral varactor of claim 6, wherein:
   said anode is disposed on the surface of said active layer;
   said active layer having at least first and second regions respectively underlying said first and second anode sections, with the punch-through in said first active layer region occurring at a greater voltage than the punch-through in said second active layer region.

8. The lateral varactor of claim 7, wherein the depth of said active layer is selectively controlled to create said first and second active layer regions.

9. The lateral varactor of claim 7, wherein said active layer is formed by selectively implanting a dopant in said substrate to create said first and second active layer regions.

10. The lateral varactor of claim 7, wherein said first and second active layer regions respectively comprise first and second epitaxial layers.

11. The lateral varactor of claim 7, wherein said first and second active layer regions respectively comprise first and second selectively doped regions, each with a respective doping density.

12. The lateral varactor of claim 1, wherein:
said cathode is U-shaped to define an interior anode area;
said anode is formed by at least one elongate anode projection, including first and second anode sections, extending into said anode area.

13. The lateral varactor of claim 12, wherein said second anode section of each anode projection is recessed into said active layer relative to said corresponding first anode section of each anode projection.

* * * * *